(12) United States Patent
Sobolewski et al.

(10) Patent No.: US 10,782,348 B2
(45) Date of Patent: Sep. 22, 2020

(54) AUTOMATIC DEVICE DETECTION AND CONNECTION VERIFICATION

(71) Applicant: Keithley Instruments, LLC, Solon, OH (US)

(72) Inventors: Gregory Sobolewski, Brecksville, OH (US); Justin R. Noble, Hudson, OH (US); F. Joseph Frese, IV, Cleveland, OH (US)

(73) Assignee: Keithley Instruments, LLC, Solon, OH (US)

( * ) Notice: Subject to any disclaimer, the term of this patent is extended or adjusted under 35 U.S.C. 154(b) by 116 days.

(21) Appl. No.: 15/721,617

(22) Filed: Sep. 29, 2017

(65) Prior Publication Data

US 2018/0259579 A1 Sep. 13, 2018

Related U.S. Application Data

(60) Provisional application No. 62/469,932, filed on Mar. 10, 2017.

(51) Int. Cl.
| | |
|---|---|
| *G01R 31/02* | (2006.01) |
| *G01R 31/26* | (2020.01) |
| *G01R 31/319* | (2006.01) |
| *G01R 31/317* | (2006.01) |
| *G01R 31/3193* | (2006.01) |
| *H01L 21/66* | (2006.01) |

(52) U.S. Cl.
CPC . *G01R 31/31924* (2013.01); *G01R 31/31715* (2013.01); *G01R 31/31717* (2013.01); *G01R 31/31908* (2013.01); *G01R 31/31912* (2013.01); *G01R 31/31932* (2013.01); *G01R 31/31718* (2013.01); *H01L 22/34* (2013.01); *H01L 2924/00* (2013.01); *H01L 2924/0002* (2013.01); *H01L 2924/00014* (2013.01)

(58) Field of Classification Search
CPC ......... H01L 2924/0002; H01L 2924/00; H01L 2924/00014; H01L 22/34; G01R 31/2601; G01R 31/26; G01R 31/2642; G01R 31/2621
USPC ......... 324/71, 378, 403, 415, 425, 500, 537, 324/762.01
See application file for complete search history.

(56) References Cited

U.S. PATENT DOCUMENTS

| | | | |
|---|---|---|---|
| 6,421,624 B1 * | 7/2002 | Nakayama | G01R 35/005 702/117 |
| 7,359,814 B1 * | 4/2008 | Nakayama | G01R 27/32 324/601 |
| 9,860,054 B1 * | 1/2018 | Bradley | H04L 5/14 |
| 10,116,432 B1 * | 10/2018 | Bradley | H04L 5/14 |
| 2005/0185768 A1 * | 8/2005 | Pickerd | 379/30 |

(Continued)

*Primary Examiner* — Raul J Rios Russo
(74) *Attorney, Agent, or Firm* — Miller Nash Graham & Dunn; Andrew J. Harrington

(57) ABSTRACT

Disclosed is a test and measurement instrument including a plurality of ports. The ports are configured to source a test signal into a device under test (DUT), and receive a signal response from the DUT. The test and measurement instrument also includes a measurement unit configured to measure the signal response. The test and measurement instrument further includes a processor configured to compare the signal response to a data structure. The processor also determines a classification of, and/or connections to, at least one DUT component coupled to at least one of the ports based on results of the comparison.

20 Claims, 3 Drawing Sheets

(56) References Cited

U.S. PATENT DOCUMENTS

| | | | | |
|---|---|---|---|---|
| 2005/0240373 | A1* | 10/2005 | Wubbena | H04L 43/50 |
| | | | | 702/122 |
| 2007/0276622 | A1* | 11/2007 | Pickerd | G01R 35/002 |
| | | | | 702/106 |
| 2009/0128162 | A1* | 5/2009 | Singleton | G01R 31/3191 |
| | | | | 324/555 |
| 2015/0134287 | A1* | 5/2015 | Ngo | G01R 35/007 |
| | | | | 702/85 |
| 2015/0301104 | A1* | 10/2015 | Pounds | G01R 31/28 |
| | | | | 324/750.01 |
| 2016/0252562 | A1* | 9/2016 | Biswas | G01R 33/00 |
| | | | | 324/764.01 |
| 2017/0146632 | A1* | 5/2017 | Wadell | G01R 35/005 |

* cited by examiner

AUTOMATIC DEVICE DETECTION AND CONNECTION VERIFICATION

CROSS-REFERENCES TO RELATED APPLICATIONS

The present application claims benefit from U.S. Provisional Patent Application Ser. No. 62/469,932, filed Mar. 10, 2017, and entitled "Automatic Device Detection And Connection Verification," which is incorporated herein by reference as if reproduced in its entirety.

FIELD OF THE DISCLOSURE

This disclosure is directed to systems and methods associated with aspects of a test and measurement system, and, more particularly, to systems and methods for automatically verifying connections and/or identifying/classifying connections in a test and measurement system.

BACKGROUND

Certain test and measurement systems are designed to source current/voltage or sink current/voltage while simultaneously measuring a device's response. This allows such test and measurement systems to identify and characterize a wide range of devices. A device to be tested may be referred to as a Device Under Test (DUT). Complex test systems may allow many test devices and/or sub-components to be coupled to the test and measurement system and tested simultaneously, in predefined sequences, etc. Accordingly, a DUT may be coupled to a test and measurement system by a complicated array of cables. In such test setups, a user may be expected to designate all test components to the test and measurement system prior to testing. Such designations may be entered incorrectly or even rendered incorrect when cable connections are changed without updating the test and measurement system. This problem is especially acute when multiple users have access to the same test setup.

Examples in the disclosure address these and other issues.

BRIEF DESCRIPTION OF THE DRAWINGS

Aspects, features and advantages of embodiments of the present disclosure will become apparent from the following description of embodiments in reference to the appended drawings in which.

DETAILED DESCRIPTION

Examples of the disclosed subject matter include a test and measurement system, such as a SMU or collection of SMUs, with multiple ports. The test and measurement system is configured to classify the DUT components coupled to each port, for example by applying test signals across the ports and measuring the signal responses. As a specific example, the test and measurement system may perform voltage and/or current sweeps across one of more of the ports and measure the resulting signal responses at one or more of the ports. The signal response may then be compared to a data structure, such as a set of profiles, a set of rules, a decision tree, a neural network, etc., to classify the DUT components attached to each port. As a specific example, the test and measurement system may employ such information to determine that a DUT resistor is coupled to a first port, a gate of a DUT transistor is coupled to a second port, etc. DUT components on a first port may be classified by the current, voltage, and/or signal response on the first port and/or related ports (e.g. second port, third port, etc.) As non-limiting examples, resistors, diodes, Light Emitting Diodes (LEDs), Schottky diodes, inductors, capacitors, Metal Oxide Semiconductor Field Effect Transistors (MOSFETs), negative MOSFETs (n-FETs), positive MOSFETs (p-FETS), Bipolar Junction Transistors (BJTs), etc. can all be classified according to signal responses in the time and/or frequency domain at one or more related ports.

Once the classifications of the DUT component(s) are complete, the classifications for each component may be employed to enable various functions. In one example, a user may enter a mapping of DUT components to SMU ports. The SMU may then classify the DUT components and verify that the provided mapping is correct or indicate any erroneous cable connections. In another example, an SMU may automatically generate such a mapping based on the determined classifications. This may be accomplished, for example, upon receiving user input requesting an auto configuration of a test setup. In yet another example, an SMU may use such classifications to determine paths between DUT components in the DUT. In yet another example, an SMU may employ such classifications to provide a particular Graphical User Interface (GUI), suggest particular tests, and/or automatically perform particular tests on a corresponding DUT component. In yet another example, an SMU may employ a general classification (e.g. transistor) to select additional tests to determine a sub-classification (e.g. MOSFETs).

Figure 1:
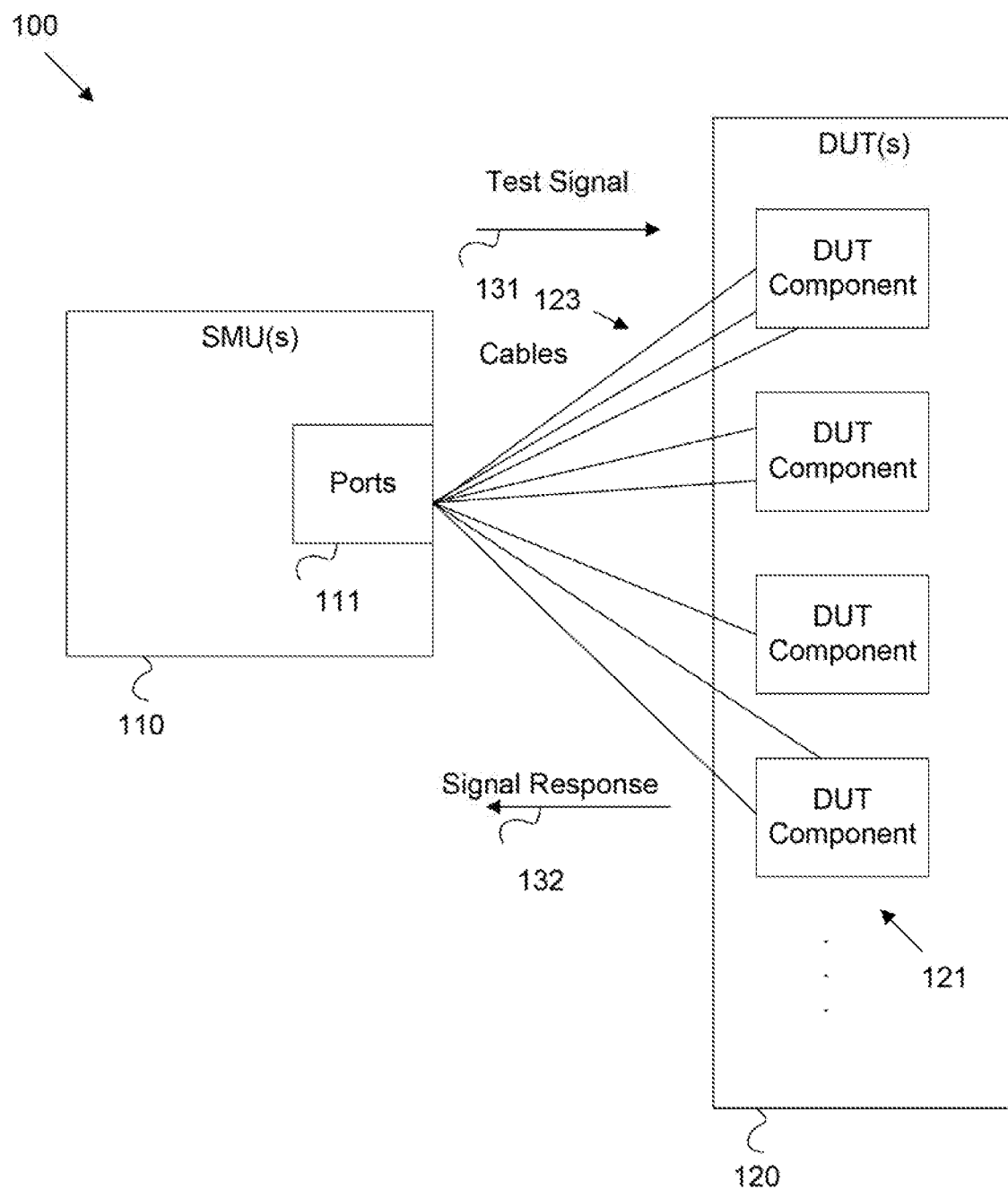
FIG. 1 is a schematic diagram of an example test and measurement system including a Source Measurement Unit (SMU) for testing multiple components of a DUT.

FIG. 1 is a schematic diagram of an example test and measurement system 100 including a Source Measurement Unit (SMU) 110 for testing multiple components of a DUT 120. An SMU 110 is any device capable of simultaneously sourcing and measuring voltage and/or current. An SMU 110 may be configured to perform current and/or voltage sweeps across any of four operating quadrants as defined by positive voltage and positive current, negative voltage and positive current, positive voltage and negative current, and negative current and negative voltage. While a single SMU 110 is depicted, it should be noted that multiple SMUs 110 may operate in concert as part of a test and measurement system 100. The SMU 110 includes a plurality of ports 111. The ports 111 are interfaces configured to couple a test signal to a DUT 120 and receive a signal response from the DUT 120. Hence the ports 111 are bidirectional.

The ports 111 can be coupled to the DUT 120 via a plurality of cables 123. A cable 123 is any electrical bidirectional signal coupling medium (e.g. coaxial cables). The cables 123 are coupled to various DUT components 121 in the DUT 120. A DUT 120 is any device that a user desires to test. A DUT component 121 is any component of the DUT 120. DUT components 121 may include any electronic component. For example, DUT components 121 may include resistors, diodes, LEDs, Schottky diodes, inductors, capacitors, MOSFETs, n-FETs, p-FETS, BJTs, etc. The preceding list is exemplary, as many electronic devices may be used by a DUT 120 and tested by an SMU 110. As shown in FIG. 1, DUT components 121 may be contain varying numbers of test points. For example, a transistor may be tested at a source, a drain, a gate, and a ground, while a resistor may be tested at an input and an output. Further, a user may not elect to test all potential test points. Complicated DUTs 120 may contain a complicated array of DUT components 121. As such, the cable 123 connections between the ports 111 and the DUT components 121 may be equally complicated. Further, multiple DUTs 120 may be employed in the same test setup. As such, the potential complexity of system 100 is only limited by the end user's needs. Further complicating matters, most DUT components do not contain internal logic, and hence are unable to identify themselves via signaling protocols.

As noted above, misconnected cables 123 result in unexpected and/or inaccurate results and can even lead to failure of the component being tested (e.g., due to application of too much voltage). Accordingly, the SMU 110 is configured to determine which DUT component 121 is connected to which port 111 to support system 100 operation. Specifically, the ports 111 of the SMU 110 are configured to source a test signal 131 toward the DUT 120. The test signal 131 may be any positive or negative current and/or positive or negative voltage generated by a power source in the SMU 110. For example, the test signal 131 may be a current/voltage sweep in the time and/or frequency domain. In another example, the test signal 131 may be a signal pulse of a predetermined duration. The test signal 131 may be forwarded across a single port 111, across a plurality of ports 111 in a sequence, across a plurality of ports 111 simultaneously, etc. A signal response 132 is then received from the DUT components 121 across the cables 123. The signal response 132 is any electrical signal that results from application of a test signal 131. The signal response 132 at a port 111 varies depending on the DUT component 121 and, in some cases, even the interface of the DUT component 121 coupled to the corresponding port 111.

As such, a measurement unit in the SMU 110 is configured to measure the signal response 132, for example across each port. The signal response 132 is then compared to a data structure to determine a classification of the DUT components 121 coupled to the ports 111 (e.g. based on results of the comparison). As the signal response 132 at each port 111 is different depending on which DUT component 121 coupled to the port 111, the classification can be employed to determine and/or verify a mapping between DUT components 121 and ports 111. The data structure may be a decision tree, a plurality of DUT component profiles, a neural network, a database, or combinations thereof. The data structure may be stored on the SMU 110 and/or accessed remotely, for example via an Internet, Local Area Network (LAN) or other network connection. As a particular example, the SMU 110 may source the test signal 131 on a first of the ports 111 and determine the classification of a DUT component 121 by comparing the signal response 132 on a second of the ports 111.

The classification of the DUT components 121 can be employed to perform various actions at the SMU 110. The classification may indicate both the type of the DUT components 121 (e.g. transistor vs resistor) and the particular terminal of the DUT component 121 (e.g. transistor source vs transistor gate) connected to a corresponding port 111. Hence, the SMU 110 may accept a mapping from the user indicating the connections between the ports 111 and the DUT components 121. The SMU 110 may then employ the classifications of the DUT components 121 to verify that the mapping is correct. If a mapping is incorrect, the SMU 110 may indicate an error notification on a particular port 111 and/or correct/remap the mapping. In another example, the SMU 110 may employ the classifications of the DUT components 121 to generate a mapping without requiring user input. In another example, the SMU 110 may employ the determined classification of the DUT components 121 to provide a particular GUI for corresponding DUT components 121. The SMU 110 may also employ the determined classification of the DUT components 121 to suggest tests that are relevant to the corresponding DUT components 121. The SMU 110 may also employ the determined classification of the DUT components 121 to perform particular tests that are relevant to the corresponding DUT components 121 automatically without requiring user interaction. In some cases, the SMU 110 may even determine a pathing in the DUT 120 between a plurality of DUT components 121 by comparing the signal response(s) 132 to the data structure. Such information can then be automatically added to the mapping and/or displayed to a user via a display.

It should also be noted that some test signals 131 and corresponding signal responses 132 may indicate a general classification of a DUT component 121 (e.g. diode) without indicating a particular sub-classification of the DUT component 121 (e.g. LED). As such, a classification may be employed to send additional test signals 131 and measure additional signal responses 132 tailored to the DUT component 121. Such additional signal responses 132 may then be compared to the data structure to determine the sub-classification of the DUT component 121. For example, an initial round of test signals 131 may be limited to specified current and/or voltage thresholds. Such thresholds may be selected to prevent damage to the DUT components 121 regardless of which component 121 is coupled to which port 111. Once a classification is made for a DUT component 121 more tailored tests may be employed. For example, current/voltage may be increased to DUT components 121 capable of accepting more current/voltage. Such additional current/voltage may provide further insight as to the nature of the coupled DUT component 121. This includes, but is not limited to pulse stimulus/measure, and AC stimulus/measure. As an example, the initial thresholds of current and/or voltage may be selected such that they are within the limits of the most fragile DUT component. Once the ports coupled with that most fragile DUT component are determined, then the threshold can be increased based upon the next most fragile component and so on until all port connections have been classified. As used in this context, fragile refers to the ability of a component to handle a level of voltage and/or current without failing.

It should also be noted that while an SMU 110 is depicted in system 100, any test and measurement system (e.g. oscilloscope) capable of simultaneously sourcing a test signal 131 and measuring a signal response 132 may be employed within the scope of the present disclosure.

Figure 2:
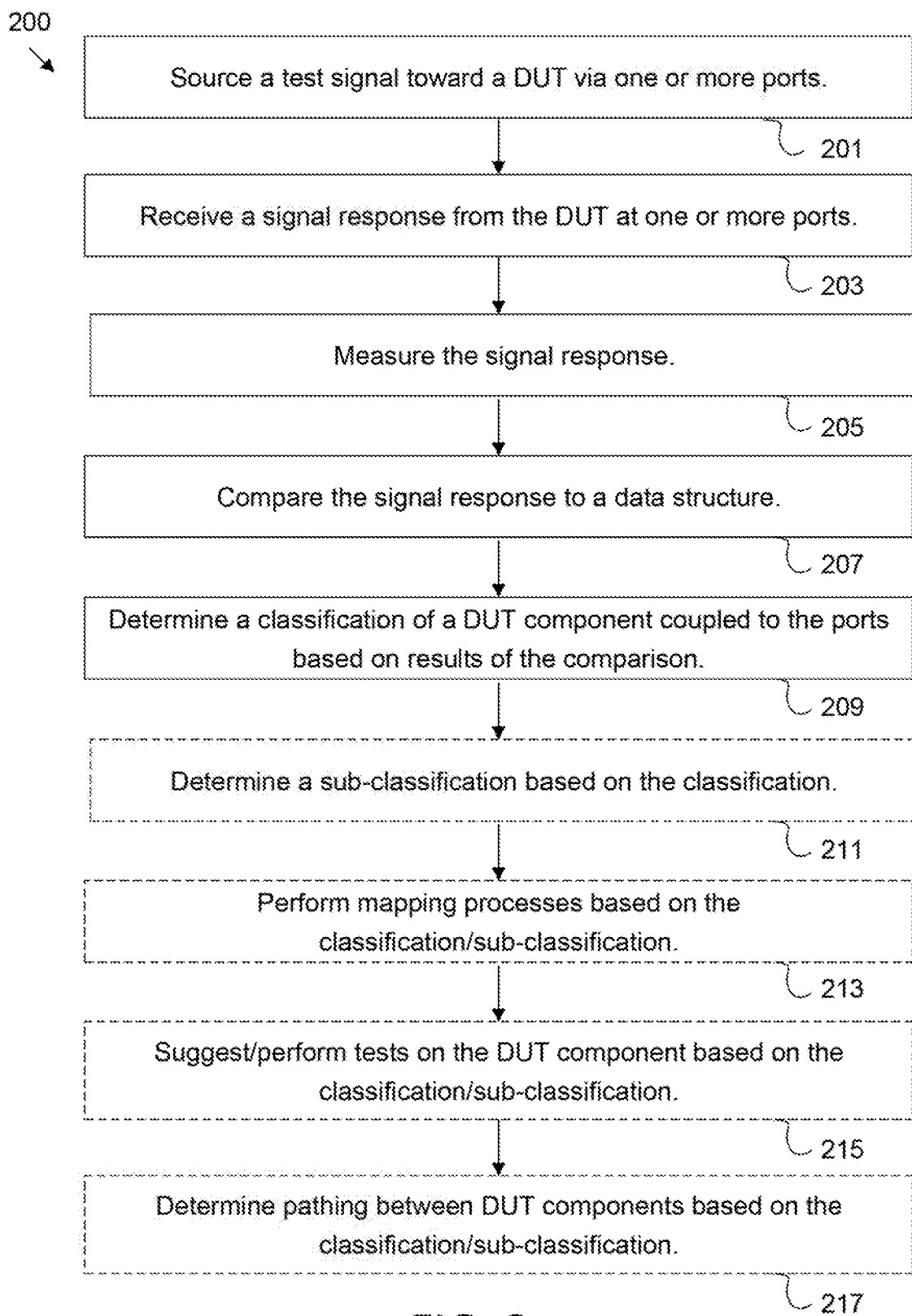
FIG. 2 is an example flowchart of an example method for automatically classifying DUT components.

FIG. 2 is an example flowchart of an illustrative method 200 for automatically classifying DUT components, such as DUT components 121. For example method 200 may be implemented by an SMU 110 and/or a test instrument 300. As an example, method 200 may be initiated upon receiving user input requesting verification of a test setup. As another example, method 200 may be initiated periodically by a testing system. In other words, the method 200 may operate periodically as a background process and send notifications to the user as desired via a GUI on a display.

At block 201, one or more of test signals, such as test signal(s) 131, are sourced, for example by a controllable power source. The test signals are forwarded toward a DUT over a plurality of ports. The test signals may be forwarded in sequence across the ports. The test signals may also be forwarded iteratively, for example initiating method 200 repeatedly and by forwarding a signal on a subsequent port on each repetition of method 200 until all ports have been tested. In either case, a signal response is received at block 203. The signal response is responsive to the test signals of block 201, and is received over one or more of the ports. The signal response of block 203 varies based on the DUT component coupled to the port being tested at block 201 as well as the interconnections of the components in the DUT. For example, when a test signal is forwarded across a port coupled to a transistor gate at block 201, responsive signals are received over ports coupled to the transistor's source and drain at block 203. Responsive signals may also be received from ports coupled to other DUT components connected to the transistor, etc.

At block 205, the signal response from the DUT, as received in block 203, is measured by the SMU/test instrument. The measured signal response is then compared to a data structure at block 207. As noted above, the data structure may be a set of rules, such as a decision tree. The data structure may also be a set of profiles containing signal response parameters associated with various known DUT components. In some examples, the data structure may be a neural network generated according to machine learning principles. In such cases, the data structure can be trained by employing a labeled training data set for components (i.e., supervised learning). This training can include performing feature extraction on the training data set and classifying the features in accordance with the labels of the training data set. The machine learning algorithm can then generate classification rules based on the extracted features to aid in correctly identifying the components coupled with each port according to the labels of the training data set. Such rules can be represented by an artificial neural network (e.g., a convolutional neural network), decision tree, support vector machine, or any other suitable machine learning classification mechanism that can be employed for comparison at block 207. A classification of one or more DUT components coupled to the ports is determined at block 209 based on results of the comparison of block 207.

For example, a voltage sweep across a resistor input results in linearly changing current response on a resistor output. Accordingly, a test signal including a voltage sweep sent across a first port may result in a signal response of a linearly changing current on a second port indicates a resistor is connected between the first port and the second port. Hence, sourcing a test signal on a first of the test instrument ports allows for a determination of the classification of the DUT component by comparing the signal response on a second of the ports. As another example, a port coupled to the input of a capacitor would receive a signal response of a constant current and a port coupled between the output of a capacitor and a ground would receive a signal response of a minimal current (e.g. less than 10 microamps (uA)). A minimal current, as used herein, indicates a current that is zero for most practical purposes, for example less than 10 uA. As yet another example, applying a voltage sweep to a n-FET gate results in a port coupled to the n-FET source receiving a signal response of initially minimal current that increases toward a compliance threshold. Further illustrative signal responses are shown in table 1 below in terms of current when a test signal is applied. It should be noted that the table below is presented to clarify the concepts disclosed herein. Many signal tests may be employed and signal responses measured and classified to determine a wide variety of electronic DUT components. It should also be noted that in some cases, a DUT component may not be classified. In some examples, failure to classify the DUT component may be communicated to a user via a display. The user may then indicate a classification for the DUT component. The system may then store the classification and information related to the signal response, which may allow the system to learn the newly entered classification by updating the relevant rules, profiles, etc.

TABLE 1

| Device/Connection | Port measured | Result when voltage sweep −5 v to 5 V on port one, port two constant | Result when voltage sweep −5 v to 5 V on port two, port one constant |
|---|---|---|---|
| Resistor to port one to ground | Port one | linearly changing current | current less than 10 uA |
| | Port two | current less than 10 uA | current less than 10 uA |
| Resistor to port two to ground | Port one | current less than 10 uA | current less than 10 uA |
| | Port two | current less than 10 uA | linearly changing current |
| Resistor to port one to port two | Port one | linearly changing current | linearly changing current |
| | Port two | linearly changing current, opposite polarity | linearly changing current, opposite polarity |
| Capacitor to port one to ground | Port one | constant current | current less than 10 uA |
| | Port two | current less than 10 uA | current less than 10 uA |
| Capacitor to port two to ground | Port one | current less than 10 uA | current less than 10 uA |
| | Port two | current less than 10 uA | constant current |
| Capacitor to port one to port two | Port one | constant current | constant current |
| | Port two | constant current, opposite polarity | constant current, opposite polarity |
| Schottky diode to port one to ground | Port one | less than 10 uA in one polarity, increasing to compliance below 0.4 V | current less than 10 uA |
| | Port two | current less than 10 uA | current less than 10 uA |

TABLE 1-continued

| Device/Connection | Port measured | Result when voltage sweep −5 v to 5 V on port one, port two constant | Result when voltage sweep −5 v to 5 V on port two, port one constant |
|---|---|---|---|
| Schottky diode to port two to ground | Port one | current less than 10 uA | current less than 10 uA |
| | Port two | current less than 10 uA | less than 10 uA in one polarity, increasing to compliance below 0.4 V |
| Schottky diode to port one to port two | Port one | less than 10 uA in one polarity, increasing to compliance below 0.4V | less than 10 uA in one polarity, increasing to compliance below 0.4 V |
| | Port two | Same as port one but, opposite polarity | Same as port one but opposite polarity |
| Silicon diode to port one to ground | Port one | less than 10 uA in one polarity, increasing to compliance below 0.8 V but above 0.4 V | current less than 10 uA |
| | Port two | current less than 10 uA | current less than 10 uA |
| Silicon diode to port two to ground | Port one | current less than 10 uA | current less than 10 uA |
| | Port two | current less than 10 uA | less than 10 uA in one polarity, increasing to compliance below 0.8 V but above 0.4 V |
| Silicon diode to port one to port two | Port one | less than 10 uA in one polarity, increasing to compliance below 0.8 V but above 0.4 V | less than 10 uA in one polarity, increasing to compliance below 0.4 V |
| | Port two | Same as port one but opposite polarity | Same as port one but opposite polarity |
| LED diode to port one to ground | Port one | less than 10 uA in one polarity, increasing to compliance above 1.2 V | current less than 10 uA |
| | Port two | current less than 10 uA | current less than 10 uA |
| LED diode to port two to ground | Port one | current less than 10 uA | current less than 10 uA |
| | Port two | current less than 10 uA | less than 10 uA in one polarity, increasing to compliance above 1.2 V |
| LED diode to port one to port two | Port one | less than 10 uA in one polarity, increasing to compliance above 1.2 V | less than 10 uA in one polarity, increasing to compliance above 1.2 V |
| | Port two | Same as port one but opposite polarity | Same as port one but opposite polarity |
| n-FET gate to port one, source to port two, drain to ground | Port one | current less than 10 uA | current less than 10 uA |
| | Port two | less than 10 uA in one polarity, increasing toward compliance above threshold | starts in compliance and decreases to less than 10 uA |
| n-FET source to port one, gate to port two, drain to ground | Port one | starts in compliance and decreases to less than 10 uA | less than 10 uA in one polarity, increasing toward compliance above threshold |
| | Port two | current less than 10 uA | current less than 10 uA |
| n-FET drain to port one, source to port two, gate to ground | Port one | starts in compliance and decreases to less than 10 uA | less than 10 uA in one polarity, increasing to compliance above 0.8 V |
| | Port two | Same as port one but opposite polarity | Same as port one but opposite polarity |
| n-FET gate to port one, drain to port two, source to ground | Port one | current less than 10 uA | current less than 10 uA |
| | Port two | less than 10 uA in one polarity, increasing toward compliance above threshold | starts in compliance and decreases to less than 10 uA |
| n-FET source to port one, drain to port two, gate to ground | Port one | less than 10 uA in one polarity, increasing to compliance above 0.8V | starts in compliance and decreases to less than 10 uA |
| | Port two | Same as port one but opposite polarity | Same as port one but opposite polarity |

TABLE 1-continued

| Device/Connection | Port measured | Result when voltage sweep −5 v to 5 V on port one, port two constant | Result when voltage sweep −5 v to 5 V on port two, port one constant |
|---|---|---|---|
| n-FET drain to port one, gate to port two, source to ground | Port one | starts in compliance and decreases to less than 10 uA | less than 10 uA in one polarity, increasing toward compliance above threshold |
| | Port two | current less than 10 uA | current less than 10 uA |

Once the classification is determined at block 209, one or more actions may be carried out based on the determined classification. Illustrative ones of these actions are represented by optional blocks 211-217, however, it will be appreciated that other actions can be carried out based upon the determined classification. For example, at optional block 211, a sub-classification of a DUT component can be determined based on the classification of the component. For example, a compliance voltage/current may be employed to determine a basic classification for the components on each port. The compliance voltage/current can be set to a small value selected to prevent damage to any arbitrary component. One the basic classification of the component is known, (e.g. diode) a second test signal can be employed to determine additional characteristics of the component. A second signal response may then be measured and compared to the data structure as discussed above to determine a sub-classification (e.g. LED). The second test signal may employ higher voltage/current and/or different ranges than the first test signal based on an understanding of the classified component's known characteristics. In other words, the classification informs the test signals that can be employed without damaging the DUT component. Hence the classification allows for more detailed testing to determine sub-classifications.

At block 213, mapping processes may be performed based on the classification(s) of block 209 and/or the sub-classification(s) of block 211. As a specific example, a mapping of DUT components to the ports may be received from a user and stored in a memory. The classifications/sub-classifications of the DUT components may be employed to verify the mapping. The user may then be notified of any mapping errors (e.g. due to incorrect cable connections). In some examples, the mapping may also be remapped/corrected based on the determined classifications/sub-classifications in order to correct any connection errors. This can be done automatically or through user input (e.g., prompting user for authorization before remapping).

At optional block 215, one or more component tests are suggested for the DUT component(s) based on the classification(s) at block 209 and/or sub-classification(s) at block 211. Such tests may be suggested via a GUI on a display. Accordingly, the suggested tests are tailored for the determined component(s). In some cases, such component tests may be performed automatically without requiring user input. In some cases, a tailored GUI may be presented that is specific to the determined component(s). For example, a different GUI may be presented for testing transistor logic than testing capacitor charging/discharging characteristics. These tests, or the procedures associated therewith, can be stored, either locally or remotely, in a data store that correlates the determined component(s) with applicable tests which can then be applied automatically with or without an authorization prompt or through selection by the user.

At optional block 217 a pathing between DUT components is determined by comparing the signal responses to the data structure (e.g. based on the classification(s) at block 209 and/or sub-classification(s) at block 211). For example, a signal applied to the output of one component may result in a corresponding change at an adjacent connected component. Once the DUT components are classified, the signal response of one component caused by a test signal on an adjacent connected component can be predicted. The actual signal response can then be employed to determine DUT component connections without requiring user input. Such data can be, for example, automatically updated in the system, auto filled for the user for other purposes, and/or presented to the user via a GUI.

Figure 3:
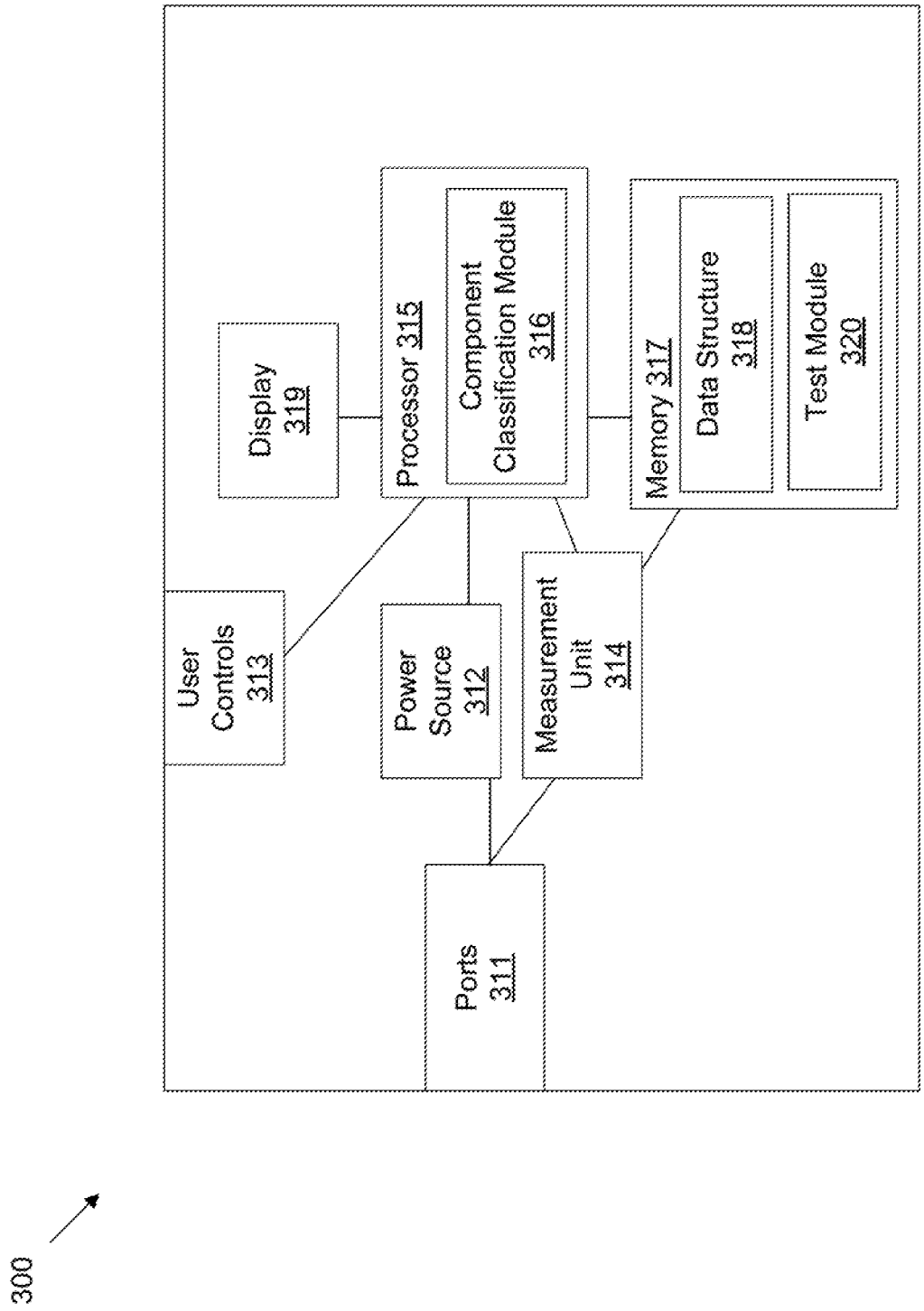
FIG. 3 is a schematic diagram of an example test instrument for automatically classifying DUT components

FIG. 3 is a schematic diagram of an example test instrument 300, such as SMU 110, for automatically classifying DUT components, and which can be employed to implement the mechanisms disclosed herein. The instrument 300 includes a plurality of ports 311 which may be any electrical signaling medium, and may be substantially similar to ports 111. Ports 311 may include receivers, transmitters, and/or transceivers. Ports 311 are coupled to a power source 312. Power source 312 is controllable by a processor 315. Power source 312 is any component configured to source a test signal by precisely generating and outputting positive and/or negative current and positive and/or negative voltage. The power source 312 is further configured to forward the test signal to any combination of ports 311 as directed by the processor 315. The ports 311 are also connected to a measurement unit 314. The measurement unit 314 is any component capable of measuring a signal response. The measurement unit 314 may contain conditioning circuits, an analog to digital converter, and other circuitry to convert the signal response to a waveform for further analysis. The resulting waveform is then stored in a memory 317. The measurement unit 314 measures the signal responses from the ports 311 as directed by the processor 315.

The processor 315, may be implemented as any processing circuitry, such as an application specific integrated circuit (ASIC), a digital signal processor (DSP), a field programmable gate array (FPGA), etc. The processor 315 is configured to execute instructions from memory 317 and may perform any methods and/or associated steps indicated by the instructions. The processor 315 may include a component classification module 316, which may implement method 200 and/or any other methods disclosed by classifying DUT components according to a signal response at the measurement unit 314 resulting from a test signal from the power source 312. In some embodiments, the component classification module 316 may be implemented in whole or in part in memory 317 as well. Memory 317 may be implemented as processor cache, random access memory (RAM), read only memory (ROM), solid state memory, hard disk drive(s), any other memory type, or any computer-readable media. Memory 317 acts as a medium for storing data, computer program products, and other instructions, and providing such data/products/instruction to the processor 315 for computation as desired. Memory 317 also stores measured signal responses (e.g. waveforms) for use in classification by the processor 315. Memory 317 may also store DUT component to port mappings as generated based on classification/sub-classification and/or as received from a user. Memory 317 also includes a data structure 318 for use in component classification as discussed above. Data structure 318 may include any rules, decision tree, neural network, database, profiles, or other data item containing information sufficient to distinguish between DUT component classifications based on measured signal responses. As noted above, the data structure 318 may be implemented in whole or in part on the test instrument 300. The data structure 318 may also be implemented remotely in some examples, in which case the processor 315 may access the data structure by a network connection, for example over the Internet. The memory 317 can also include a testing module 320 that includes tests correlated with components that can be applied to the components based on the determined classification/sub-classification. These tests can take the form of instructions, which, when executed by processor 315 can cause test instrument 300 to perform the test. While depicted as a single memory 317, it will be appreciated that the memory 317 can be composed of any number of memory modules or other computer-readable storage media, or any combination thereof User controls 313 are coupled to the processor 315. User controls 313 may include a keyboard, mouse, trackball, touchscreen, and/or any other controls employable by a user to interact with component classification module 216 via a GUI on a display 319. The display 319 may be a digital screen (e.g., light-emitting diode (LED) based display), a cathode ray tube based display, or any other monitor to display results of DUT classifications, mappings, errors, suggested tests, test results, or other results to a user as discussed herein.

Examples of the disclosure may operate on a particularly created hardware, on firmware, digital signal processors, or on a specially programmed computer including a processor operating according to programmed instructions. The terms "controller" or "processor" as used herein are intended to include microprocessors, microcomputers, ASICs, and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable medium such as a hard disk, optical disk, removable storage media, solid state memory, RAM, etc. As will be appreciated by one of skill in the art, the functionality of the program modules may be combined or distributed as desired in various examples. In addition, the functionality may be embodied in whole or in part in firmware or hardware equivalents such as integrated circuits, field programmable gate arrays (FPGA), and the like. Particular data structures may be used to more effectively implement one or more aspects of the disclosure, and such data structures are contemplated within the scope of computer executable instructions and computer-usable data described herein.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include Random Access Memory (RAM), Read Only Memory (ROM), Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 includes a test and measurement instrument comprising: a plurality of ports configured to: source a test signal toward a device under test (DUT), and receive a signal response from the DUT; a measurement unit configured to measure the signal response; and a processor configured to: compare the signal response to a data structure, and determine a classification of at least one DUT component coupled to at least one of the ports based on results of the comparison.

Example 2 includes the test and measurement instrument of Example 1, further comprising a memory to store a mapping of DUT components to the plurality of ports, and wherein the processor is further configured to correct the mapping based on the determined classification.

Example 3 includes the test and measurement instrument of any one of Examples 1-2, wherein the processor is further configured to: receive a mapping of DUT components coupled to the plurality of ports, and employ the classification of the at least one DUT component to verify the mapping.

Example 4 includes the test and measurement instrument of any one of Examples 1-3, further comprising a power source, wherein the processor is further configured to: cause the power source to source the test signal on a first of the ports; and determine the classification of the DUT component by comparing the signal response on a second of the ports.

Example 5 includes the test and measurement instrument of any one of Examples 1-4, further comprising a display, wherein the processor is further configured to suggest to a user, via the display, a component test for the DUT component based on the classification of the DUT component.

Example 6 includes the test and measurement instrument of any one of Examples 1-5, wherein the processor is further configured cause the measurement unit to perform a component test for the DUT component based on the classification of the DUT component.

Example 7 includes the test and measurement instrument of any one of Examples 1-6, wherein sourcing the test signal toward the DUT includes sourcing a plurality of test signals across the ports, and the processor is further configured to determine a pathing between a plurality of DUT components by comparing the signal response to the data structure.

Example 8 includes the test and measurement instrument of any one of Examples 1-7, wherein the data structure is a decision tree, a plurality of DUT component profiles, a neural network, a database, or combinations thereof.

Example 9 includes the test and measurement instrument of any one of Examples 1-8, wherein the processor is further configured to determine a sub-classification of the at least one DUT component based on the classification of the at least one DUT component by causing the ports to source a second test signal, causing the measurement unit to measure a second signal response, and comparing the second signal response to the data structure.

Example 10 includes a method comprising: sourcing a plurality of test signals toward a device under test (DUT) over a plurality of ports; measuring a plurality of signal responses from the DUT; comparing the signal responses to a data structure; and determining classifications of one or more DUT components coupled to the ports based on results of the comparisons.

Example 11 includes the method of Example 10, further comprising: storing a mapping of DUT components to the plurality of ports; and remapping the mapping based on the determined classifications.

Example 12 includes the method of any one of Examples 10-11, further comprising: receiving a mapping of DUT components coupled to the plurality of ports, and employing the classifications of the DUT components to verify the mapping.

Example 13 includes the method of any one of Examples 10-12, further comprising suggesting one or more component tests for the one or more DUT components based on the classifications of the DUT components.

Example 14 includes the method of any one of Examples 10-13, further comprising performing a component test for the one or more DUT components based on the classifications of the DUT components.

Example 15 includes the method of any one of Examples 10-14, further comprising determining a pathing between DUT components by comparing the signal responses to the data structure.

Example 16 includes a computer readable storage medium having instructions stored thereon that, when executed by a processor of a source measurement unit (SMU), cause the SMU to: source at least one test signal toward a device under test (DUT) over at least one of a plurality of ports; measure a signal response from the DUT; compare the signal response to a data structure; and determine a classification of at least one DUT component coupled ports based on results of the comparison.

Example 17 includes the computer readable storage medium of Example 16, wherein the instructions further cause the SMU to: source the test signal on a first of the ports; and determine the classification of the DUT component by comparing the signal response on a second of the ports.

Example 18 includes the computer readable storage medium of any one of Examples 16-17, wherein the instructions further cause the SMU to suggest to a user, via a display, a component test for the DUT component based on the classification of the DUT component.

Example 19 includes the computer readable storage medium of any one of Examples 16-18, wherein the instructions further cause the SMU to determine a sub-classification of the at least one DUT component based on the classification of the at least one DUT component by sourcing a second test signal, measuring a second signal response, and comparing the second signal response to the data structure.

Example 20 includes the computer readable storage medium of any one of Examples 16-19, wherein the instructions further cause the SMU to: receive a mapping of DUT components coupled to the plurality of ports, and employ the classification of the DUT component to verify the mapping.

The previously described examples of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

We claim:

1. A test and measurement instrument comprising:
a plurality of ports configured to:
source a test signal toward a device under test (DUT), and
receive a signal response from the DUT;
a measurement unit device having a power source to generate the test signal and configured to measure the signal response as one of either voltage or current; and
a processor configured to:
access a stored data structure;
compare the signal response to the data structure, and
determine a classification of at least one DUT component coupled to at least one of the ports based on results of the comparison.

2. The test and measurement instrument of claim 1, further comprising a memory to store a mapping of DUT components to the plurality of ports, and wherein the processor is further configured to correct the mapping based on the determined classification.

3. The test and measurement instrument of claim 1, wherein the processor is further configured to:
receive a mapping of DUT components coupled to the plurality of ports, and
employ the classification of the at least one DUT component to verify the mapping.

4. The test and measurement instrument of claim 1, wherein the processor is further configured to:
cause the power source to source the test signal on a first of the ports; and
determine the classification of the DUT component by comparing the signal response on a second of the ports.

5. The test and measurement instrument of claim 1, further comprising a display, wherein the processor is further configured to suggest to a user, via the display, a component test for the DUT component based on the classification of the DUT component.

6. The test and measurement instrument of claim 1, wherein the processor is further configured cause the measurement unit to perform a component test for the DUT component based on the classification of the DUT component.

7. The test and measurement instrument of claim 1, wherein sourcing the test signal toward the DUT includes sourcing a plurality of test signals across the ports, and the processor is further configured to determine a pathing between a plurality of DUT components by comparing the signal response to the data structure.

8. The test and measurement instrument of claim 1, wherein the data structure is a decision tree, a plurality of DUT component profiles, a neural network, a database, or combinations thereof.

9. The test and measurement instrument of claim 1, wherein the processor is further configured to determine a sub-classification of the at least one DUT component based on the classification of the at least one DUT component by causing the ports to source a second test signal, causing the measurement unit to measure a second signal response, and comparing the second signal response to the data structure.

10. A method comprising:
sourcing a plurality of test signals toward a device under test (DUT) over a plurality of ports;
measuring a plurality of signal responses from the DUT;
accessing a stored data structure;
comparing the signal responses to the data structure; and
determining classifications of one or more DUT components coupled to the ports based on results of the comparisons.

11. The method of claim 10, further comprising:
storing a mapping of DUT components to the plurality of ports; and
remapping the mapping based on the determined classifications.

12. The method of claim 10, further comprising:
receiving a mapping of DUT components coupled to the plurality of ports, and
employing the classifications of the DUT components to verify the mapping.

13. The method of claim 10, further comprising suggesting one or more component tests for the one or more DUT components based on the classifications of the DUT components.

14. The method of claim 10, further comprising performing a component test for the one or more DUT components based on the classifications of the DUT components.

15. The method of claim 10, further comprising determining a pathing between DUT components by comparing the signal responses to the data structure.

16. A computer readable storage medium having instructions stored thereon that, when executed by a processor, cause the processor to:
source at least one test signal toward a device under test (DUT) over at least one of a plurality of ports;
measure a signal response from the DUT;
access a stored data structure;
compare the signal response to a data structure; and
determine a classification of at least one DUT component coupled ports based on results of the comparison.

17. The computer readable storage medium of claim 16, wherein the instructions further cause the processor to:
source the test signal on a first of the ports; and
determine the classification of the DUT component by comparing the signal response on a second of the ports.

18. The computer readable storage medium of claim 16, wherein the instructions further cause the processor to suggest to a user, via a display, a component test for the DUT component based on the classification of the DUT component.

19. The computer readable storage medium of claim 16, wherein the instructions further cause the processor to determine a sub-classification of the at least one DUT component based on the classification of the at least one DUT component by sourcing a second test signal, measuring a second signal response, and comparing the second signal response to the data structure.

20. The computer readable storage medium of claim 16, wherein the instructions further cause the processor to:
receive a mapping of DUT components coupled to the plurality of ports, and
employ the classification of the DUT component to verify the mapping.

* * * * *